US009472702B1

(12) United States Patent
Cruz-Campa et al.

(10) Patent No.: US 9,472,702 B1
(45) Date of Patent: Oct. 18, 2016

(54) PHOTOVOLTAIC CELL WITH NANO-PATTERNED SUBSTRATE

(71) Applicants: Sandia Corporation, Albuquerque, NM (US); THE BOARD OF REGENTS OF THE UNIVERSITY OF TEXAS SYSTEM, Austin, TX (US)

(72) Inventors: Jose Luis Cruz-Campa, Albuquerque, NM (US); Xiaowang Zhou, Livermore, CA (US); David Zubia, El Paso, TX (US)

(73) Assignees: Sandia Corporation, Albuquerque, NM (US); The Board of Regents of the University of Texas System, Austin, TX (US)

( * ) Notice: Subject to any disclaimer, the term of this patent is extended or adjusted under 35 U.S.C. 154(b) by 658 days.

(21) Appl. No.: 13/681,157

(22) Filed: Nov. 19, 2012

(51) Int. Cl.
*H01L 31/00* (2006.01)
*H01L 31/0725* (2012.01)
*H01L 31/0352* (2006.01)
*H01L 31/06* (2012.01)

(52) U.S. Cl.
CPC ....... *H01L 31/0725* (2013.01); *H01L 31/0352* (2013.01); *H01L 31/06* (2013.01)

(58) Field of Classification Search
CPC .............. H01L 31/061; H01L 31/0352; H01L 31/072; H01L 31/06–31/068
USPC .................................................. 136/243–265
See application file for complete search history.

(56) References Cited

U.S. PATENT DOCUMENTS

| 4,108,684 | A | * | 8/1978 | Zanio ................... H01L 31/0368 136/258 |
| 4,450,316 | A | * | 5/1984 | Hamakawa et al. .......... 136/256 |
| 5,100,478 | A | * | 3/1992 | Kawabata ............. H01L 31/061 136/249 |
| 5,753,050 | A | * | 5/1998 | Charache et al. ............ 136/255 |
| 6,252,287 | B1 | * | 6/2001 | Kurtz et al. .................. 257/461 |
| 7,217,883 | B2 | | 5/2007 | Munzer |
| 7,517,709 | B1 | | 4/2009 | Borden |
| 7,659,475 | B2 | | 2/2010 | Agostinelli et al. |
| 7,763,535 | B2 | | 7/2010 | Trassl et al. |
| 7,812,250 | B2 | | 10/2010 | Smith |
| 7,851,698 | B2 | | 12/2010 | De Ceuster et al. |
| 2004/0079408 | A1 | * | 4/2004 | Fetzer ................... H01L 31/184 136/262 |
| 2005/0155641 | A1 | * | 7/2005 | Fafard ..................... B82Y 10/00 136/249 |
| 2006/0207647 | A1 | * | 9/2006 | Tsakalakos et al. .......... 136/256 |
| 2006/0260676 | A1 | * | 11/2006 | Gao et al. ...................... 136/252 |

(Continued)

OTHER PUBLICATIONS

Van Kerschaver, et al., "Back-Contact Solar Cells: A Review", Prog. Photovolt: Res. Appl. 2006; 14, pp. 107-123, 2006.
Nielson, et al., "Microscale C-SI (C)PV Cells for Low-Cost Power", 34th IEEE PVSC, pp. 1816-1821, 2009.
Nielson, et al., "Microscale PV Cells for Concentrated PV Applications", 24th EU PVSEC, pp. 170-173, 2009.
Guo, et al., "Two- and Three-Dimensional Folding of Thin Film Single-Crystalline Silicon for Photovoltaic Power Applications", PNAS 106, pp. 20149-20154, 2009.

(Continued)

*Primary Examiner* — Niki Bakhtiari
(74) *Attorney, Agent, or Firm* — Medley Behrens & Lewis, LLC; Martin I. Finston; Aman Talwar

(57) ABSTRACT

A photovoltaic solar cell comprises a nano-patterned substrate layer. A plurality of nano-windows are etched into an intermediate substrate layer to form the nano-patterned substrate layer. The nano-patterned substrate layer is positioned between an n-type semiconductor layer composed of an n-type semiconductor material and a p-type semiconductor layer composed of a p-type semiconductor material. Semiconductor material accumulates in the plurality of nano-windows, causing a plurality of heterojunctions to form between the n-type semiconductor layer and the p-type semiconductor layer.

11 Claims, 5 Drawing Sheets

(56) References Cited

U.S. PATENT DOCUMENTS

| | | |
|---|---|---|
| 2008/0061293 A1* | 3/2008 | Ribeyron et al. ............... H01L 31/022433 257/53 |
| 2010/0224237 A1 | 9/2010 | Kim |
| 2011/0041903 A1* | 2/2011 | Zehavi .............. H01L 31/02165 136/255 |
| 2011/0089420 A1 | 4/2011 | Prabhakar |
| 2012/0167966 A1* | 7/2012 | Hu et al. ........... H01L 31/03685 136/255 |

OTHER PUBLICATIONS

Wolden, et al., "Photovoltaic Manufacturing: Present Status, Future Prospects, and Research Needs" JVST A—Vacuum, Surfaces, and Films, vol. 29, pp. 1-62, 2011.

Morales-Acevedo, "Effective Absorption Coefficient for Graded Band-Gap Semiconductors and the Expected Photocurrent Density in Solar Cells", Solar Energy Materials & Solar Cells, vol. 93, pp. 41-44, 2009.

* cited by examiner

PHOTOVOLTAIC CELL WITH NANO-PATTERNED SUBSTRATE

STATEMENT OF GOVERNMENT INTEREST

This invention was developed under Contract DE AC04-94AL85000 between Sandia Corporation and the U.S. Department of Energy. The U.S. Government has certain rights in this invention.

BACKGROUND

The adoption of photovoltaics for generating electricity from sunlight is strongly impacted by cost considerations. At present, photovoltaic power generation systems are relatively expensive in comparison to conventional fossil-fuel-burning power generation systems in terms of watts produced per dollar required to manufacture, deploy, and maintain such systems. With more specificity, the Watt/dollar ratio for a fossil-fuel burning power generation system is higher than the Watt/dollar ratio for conventional photovoltaic systems. This disparity in cost has prevented wide-spread adoption of photovoltaic power generation systems.

Thin film photovoltaic cells are exemplary cells that can be included in photovoltaic power generation systems. Conventionally, $1/Watt for a cell module is seen as the cost barrier at which photovoltaic cells would achieve cost parity with existing electric grids. While some thin film photovoltaic cells have surpassed this cell module cost barrier, such as, for example, Cadmium Telluride (CdTe) cells, other factors have impeded price parity. For example, persistently low photovoltaic module efficiencies of ~12% in CdTe cells create balance-of-system issues, which typically raise the implementation cost of photovoltaic power generation systems to as much as 2-4 times the cost of power purchased from existing electric grids despite being manufactured at or below the $1/Watt cell module price point.

While some thin film photovoltaic cells have a high theoretical efficiency, practical performance has remained stagnant. For example, while CdTe cells have an ideal direct band gap of 1.5 eV and are capable of a theoretical maximum single junction conversion efficiency of ~30%, CdTe cell performance has remained stagnant at ~16% for the last several years.

SUMMARY

The following is a brief summary of subject matter that is described in greater detail herein. This summary is not intended to be limiting as to the scope of the claims.

Described herein are various technologies pertaining to a photovoltaic cell. With more particularity, various technologies pertaining to a photovoltaic cell that comprises a nano-patterned substrate layer are described herein. The photovoltaic cell comprises an n-type semiconductor layer composed of an n-type semiconductor material, such as Cadmium Sulfide (CdS). A nano-patterned substrate layer is positioned immediately adjacent to the n-type semiconductor layer, wherein the nano-patterned substrate layer is composed of a suitable insulating substrate material; for example, Silicon Oxide ($SiO_2$) or Silicon Nitride ($Si_3N_4$). The nano-patterned substrate layer comprises a plurality of nano-windows, wherein each nano-window can have a respective length less than 350 nm and a respective width less than 350 nm.

The photovoltaic cell further comprises a p-type semiconductor layer that is positioned immediately adjacent to the nano-patterned substrate layer. The p-type semiconductor layer can be composed of a suitable p-type semiconductor material, such as CdTe. In other embodiments, the p-type semiconductor material can be a graded material, such as Zinc Cadmium Tellurium (e.g., of the formula $Zn_xCd_{x-1}Te$). In an exemplary embodiment, the p-type semiconductor material accumulates in the nano-windows of the nano-patterned substrate layer, causing a respective p-n junction to form in each nano-window by way of pseudomorphic crystal growth. A nano-patterned substrate disposed amongst junctions between semiconductor materials results in enhanced efficiencies, such as by reducing defects in crystal structures of the semiconductor materials.

Other aspects will be appreciated upon reading and understanding the attached figures and description.

DETAILED DESCRIPTION

Figure 1:
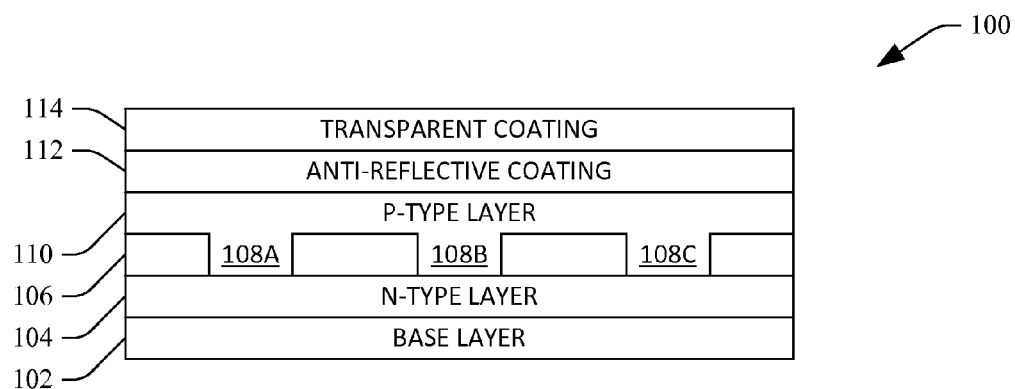
FIG. 1 is a cross sectional view of an exemplary photovoltaic cell comprising a nano-patterned substrate layer.

Various technologies pertaining to a photovoltaic cell with a nano-patterned substrate layer therein will now be described with reference to the drawings, where like reference numerals represent like elements throughout. Additionally, as used herein, the term "exemplary" is intended to mean serving as an illustration or example of something, and is not intended to indicate a preference.

Referring now to FIG. 1, a cross-sectional view of an exemplary photovoltaic cell 100 is illustrated. The photovoltaic cell 100 comprises a base layer 102. In some embodiments, the base layer 102 may be coated with a transparent conducting film, which can be composed of a material of the formula ITO. An n-type semiconductor layer 104 is positioned immediately adjacent to the base layer 102. A nano-patterned substrate layer 106 is positioned immediately adjacent to the n-type semiconductor layer 104, such that the n-type semiconductor layer 104 is disposed between the base layer 102 and the nano-patterned substrate layer 106. The nano-patterned substrate layer 106 comprises a plurality of nano-windows, collectively shown by reference numerals 108A-108C. Each nano-window has a size on the order of nanometers—e.g., one nanometer to one micron in length and width. Height of a nano-window can be on the order of nanometers or micrometers—such as between ten nanometers and ten micrometers.

The photovoltaic cell 100 further comprises a p-type semiconductor layer 110 that is positioned immediately adjacent to the nano-patterned substrate layer 106, such that the nano-patterned substrate layer 106 is disposed between the n-type semiconductor layer 104 and the p-type semiconductor layer 110. The n-type semiconductor layer 104 is exposed to the p-type semiconductor layer 110 by way of the plurality of nano-windows 108A-108C of the nano-patterned substrate layer 106. This causes multiple heterojunctions to form in the nano-windows 108A-108C of the nano-patterned substrate layer 106. In an exemplary embodiment, the heterojunctions can be p-n heterojunctions. As shown, the p-type semiconductor layer 110 is deposited onto the nano-patterned substrate, causing the p-type semiconductor material to accumulate in the nano-windows 108A-108C. In other embodiments, however, other materials, such as the n-type semiconductor material, buffer material, graded semiconductor material, intrinsic (i-type) semiconductor material, or other material can accumulate in the nano-windows 108A-108C.

Due at least in part to the relatively small size of the nano-windows 108A-108C of the nano-patterned substrate layer 106, a relatively small number (e.g., one) of crystal domains of the p-type semiconductor material grows, via pseudomorphic growth, in any one nano-window. Pseudomorphic growth reduces the formation of crystallographic defects, thus decreasing the amount of lost carriers and enhancing voltage, current and efficiency of the cell. Each nano-window in the nano-patterned substrate layer may comprise an electrically-isolated junction. An electrically-isolated junction in a nano-window of the nano-patterned substrate layer 106 is referred to herein as a nano-cell. In other embodiments, other types of material may similarly undergo pseudomorphic growth, and likewise may comprise a plurality of electrically-isolated junctions referred to as nano-cells. In yet other embodiments, the plurality of nano-widows may not be electrically isolated.

While the junctions of the photovoltaic cell 100 have been described as being p-n junctions, other junction types are contemplated and are intended to fall under the scope of the hereto-appended claims. Exemplary junction types include, but are not limited to, n-p junctions, p-i-n junctions, n-i-p junctions, multi-junctions, and the like. Similarly, while an embodiment may have a layer configuration comprising a p-n junction as described above, it should be understood that other layer configurations, such as other layer configurations comprising other types of junctions are contemplated and are intended to fall under the scope of the hereto-appended claims. For example, a Copper-Indium-Gallium-Selenide (CIGS) solar cell may comprise a p-type CIGS absorber layer deposited between a base layer and an n-type CdS buffer layer. Inclusion of the nano-patterned substrate layer 106 in the photovoltaic cell 100 has been shown in experiments to reduce defects observed in conventional photovoltaic cells.

The photovoltaic cell may further optionally comprise a contact (not shown) composed of, for instance, Copper (Cu) in carbon paste (or other suitable contact), positioned immediately adjacent to the p-type semiconductor layer 110. In another exemplary embodiment, the photovoltaic cell may further optionally comprise a graded semiconductor layer positioned immediately adjacent to the p-type semiconductor layer 110. The photovoltaic cell 100 can additionally optionally comprise a transparent coating 112 that is positioned above the p-type semiconductor layer 110, such that the p-type semiconductor layer 110 is disposed between the nano-patterned substrate layer 106 and the transparent coating 112. The photovoltaic cell can further optionally comprise an anti-reflective coating 114 that is positioned immediately adjacent to the transparent coating 112, such that the transparent coating 112 is disposed between the p-type semiconductor layer 110 and the anti-reflective coating 114.

Still further, the photovoltaic cell 100 may also optionally comprise a graded structure, which can be positioned between the n-type semiconductor layer 104 and the nano-patterned substrate layer 106. In another exemplary embodiment, a buffer layer can be positioned between the base layer 102 and the n-type semiconductor layer 104. In an example, the buffer layer can be composed of a buffer material, such as Zinc-Tellurium.

The photovoltaic cell 100 can further comprise electric contacts that facilitate retrieval of electric power from the photovoltaic cell 100. Contacting photovoltaic cells is known, and description of contacting the photovoltaic cell 100 is omitted herein for sake of brevity.

Additional details pertaining to the layers of the photovoltaic cell 100 are now provided. In an exemplary embodiment, the base layer 102 can be composed of glass, plastic, uv-stabilized polymer, or other suitable transparent material. The base layer 102 can have a thickness of, for example, about 0.5-3.0 mm. Further, in an exemplary embodiment, the base layer 102 can be coated with a transparent conducting film that acts as an ohmic contact for carrier transport through the photovoltaic cell 100. Exemplary transparent conducting films that can be coated on the base layer 102 include tin-doped indium-oxide ("ITO"), aluminum-doped zinc-oxide, and/or indium-doped cadmium-oxide. In another exemplary embodiment, the base layer 102 can be coated with a conducting polymer or a carbon nanotube thin film.

With respect to the n-type semiconductor layer 104, in an exemplary embodiment such layer 104 can be composed of a material with a band gap on the order of 2.4 eV. For instance, the n-type semiconductor layer 104 can be composed of Cadmium Sulfide (CdS). Further, thickness of the n-type semiconductor layer 104 can be between 80 and 120 nanometers. With respect to the nano-patterned substrate layer 106, in an exemplary embodiment such layer can be composed of Silicon Oxide ($SiO_2$) or Silicon Nitride ($Si_3N_4$), and can have a thickness of between 200 and 500 nanometers.

With respect to the p-type semiconductor layer 110, in an exemplary embodiment such layer 110 can have a pseudomorphic crystal structure and can be composed of a material with a band gap on the order of 1.5 eV. For instance, the p-type semiconductor layer 110 can be composed of Cadmium Telluride (CdTe), and the thickness of the p-type semiconductor layer 110 can be between 80 and 120 nanometers. In another embodiment, the p-type semiconductor layer can be composed of CIGS. In another exemplary embodiment, the p-type semiconductor layer 110 can be composed of a graded material with a band gap on the order of 2.3 eV, such as Zinc Cadmium Telluride of the formula $Zn_xCd_{x-1}Te$, wherein x varies as the semiconductor grows away from n-type semiconductor material. It is to be understood that the graded material can be positioned immediately above the p-type layer 110 (between the p-type layer 110 and the anti-reflective coating 112), immediately below the p-type layer 110 (between the p-type layer 110 and the n-type layer 106), or can be a substitute for the p-type layer 110. In still yet another exemplary embodiment, the p-type semiconductor layer can be composed of both a graded material and a pure buffer material, such as Zinc Telluride (ZnTe).

In some embodiments, an additional p-type semiconductor layer (not shown) can be deposited on the p-type semiconductor layer 110. The additional p-type semiconductor layer may be deposited such that the combined thickness of the p-type layer 110 and the additional p-type semiconductor layer is, for example, about 10 micrometers. In an exemplary embodiment, the additional p-type semiconductor layer can be composed of CdTe or ZnTe.

As mentioned above, in an exemplary embodiment, the p-type semiconductor layer 110 can be composed of graded material, and an additional p-type semiconductor layer (composed of the p-type semiconductor material) may be arranged such that graded material is between the additional p-type semiconductor layer and the n-type semiconductor layer. This may promote pseudomorphic growth of the p-type semiconductor material.

In other embodiments, the p-type semiconductor layer 110 can be composed of a graded material, and an additional p-type semiconductor layer may be arranged such that the additional p-type semiconductor layer is disposed between the graded material and the n-type semiconductor layer. This may enhance the ohmic contact and current collection of the photovoltaic cell.

In yet other embodiments, the p-type semiconductor layer 110 can be composed of a graded material, and the additional p-type semiconductor layer may be arranged such that the graded material subsumes the p-type material of the photovoltaic cell 100.

Figure 2:
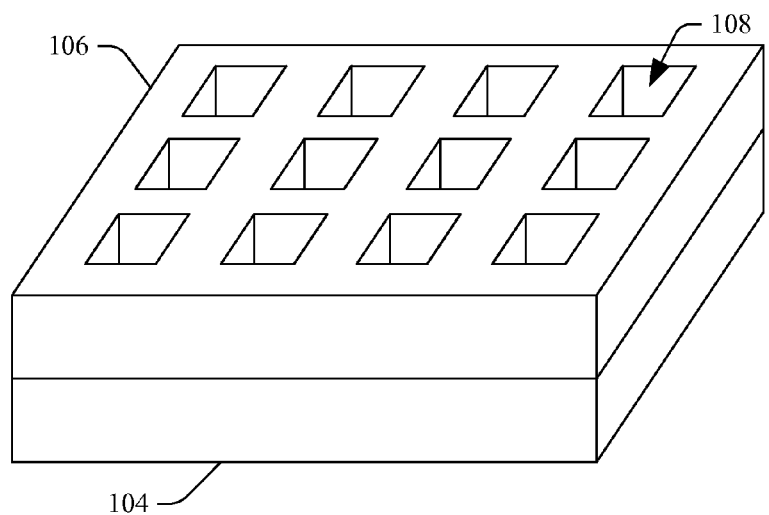
FIG. 2 is an isometric view of an exemplary nano-patterned substrate layer.

Referring now to FIG. 2, an isometric view of the nano-patterned substrate layer 106 of a photovoltaic cell 100 is shown. As discussed above, the nano-patterned substrate layer 106 comprises a plurality of nano-windows (referenced collectively by reference number 108), and is disposed between the n-type semiconductor layer 104 and the p-type semiconductor layer 110. Each nano-window in the nano-patterned substrate layer 106 can have a size of, in an exemplary embodiment, less than 350 nm in length, 350 nm in width, and 450 nm in thickness. In another exemplary embodiment, each nano-window in the nano-patterned substrate layer 106 can have a size of less than 100 nm in length, less than 100 nm in width, and less than 350 nm in thickness (height).

While different arrangements of the plurality of nano-windows 108 are suitable for a photovoltaic cell, it is to be understood that the plurality of nano-windows 108 represents an active area of the nano-patterned substrate layer 106. Therefore, minimizing the distance between nano-windows may increase the active area.

When a graded p-type semiconductor is used, a nano-window with a length and width of less than 350 nm can inhibit appearance and density of defects. If the p-type semiconductor is not a graded semiconductor, a smaller nano-window, such as, for example, a nano-window with a length and width of less than 150 nm, may also inhibit the appearance and density of defects.

While the plurality of nano-windows 108 are shown as being primarily cubic in shape, it should be understood that the plurality of nano-windows 108 may have a primarily cylindrical, irregular cylindrical, or other suitable shape.

The nano-patterned substrate layer 106 may also promote additional beneficial effects in a photovoltaic cell. For example, a nano-pattern may promote current funneling from non functioned semiconductor material to the plurality of nano-windows 108, where current may be collected. In another example, the nano-patterned substrate layer 106 may refract light that would otherwise not be absorbed into absorbent regions of the photovoltaic cell.

Figure 3:
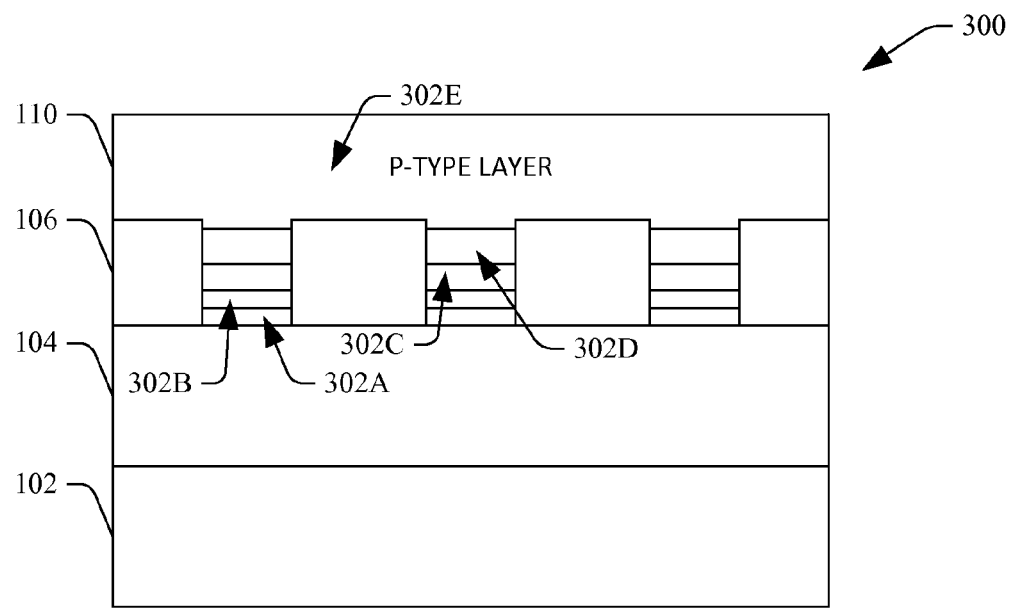
FIG. 3 is a cross-sectional view of an exemplary photovoltaic cell comprising a nano-patterned substrate layer and a graded band gap.

Referring now to FIG. 3, a cross-sectional view of an exemplary photovoltaic cell 300 comprising a nano-patterned substrate layer and a graded band gap is shown. As noted above, the p-type semiconductor layer 110 can be composed of a graded material with a band gap on the order of 2.3 eV, such as Zinc Cadmium Telluride ($Zn_xCd_{x-1}Te$). The p-type semiconductor layer 110 may comprise a plurality of graded layers 302A-E, shown by the horizontal lines in the p-type layer 110, thus providing a graded band gap for the photovoltaic cell 300.

For example, the p-type semiconductor layer 110 may comprise a first layer 302A, which forms the plurality of heterojunctions with the n-type semiconductor material of the n-type semiconductor layer 104. The first layer 302A can be composed of material of the formula $Zn_1Te$. The second layer 302B is positioned such that the first layer 302A is between the n-type semiconductor layer 104 and the second layer 302B, and can be composed of material of the formula $Zn_{0.7}Cd_{0.3}Te$. The third layer 302C is positioned such that the second layer 302B is between the first layer 102A and the third layer 302C, and can be composed of material of the formula $Zn_{0.5}Cd_{0.5}Te$. The fourth layer 302D is positioned such that the third layer 302C is between the second layer 302B and the fourth layer 302D, and can be composed of material of the formula $Zn_{0.3}Cd_{0.7}Te$. The fifth layer 302E can be positioned such that the fourth layer 302D is between the third layer 302C and the fifth layer 302E, and can be composed of material of the formula CdTe.

It should be understood that, in other embodiments, the photovoltaic cell 300 can comprise a greater or fewer number of graded layers of material of the formula $Zn_xCd_{x-1}Te$, and that different variations of the formula $Zn_xCd_{x-1}Te$ may be used. Similarly, the photovoltaic cell 300 can comprises graded layers composed of materials of formulas other than $Zn_xCd_{x-1}Te$.

Pursuant to an example, use of a graded material, and thus a graded band gap, can enhance current collection, reduce lattice mismatch between the n-type and p-type semiconductor layers 104 and 110, respectively.

Figure 4:
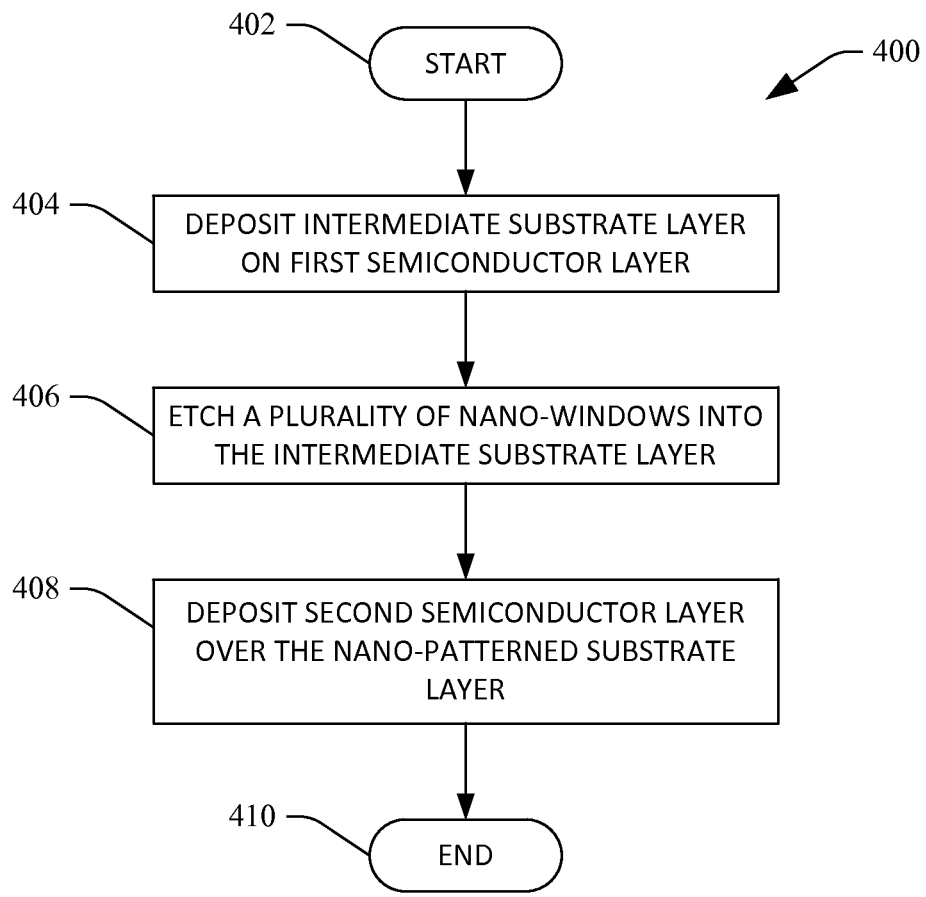
FIG. 4 is a flow diagram illustrating an exemplary methodology for producing a nano-patterned substrate layer for inclusion in a photovoltaic cell.
Figure 5:
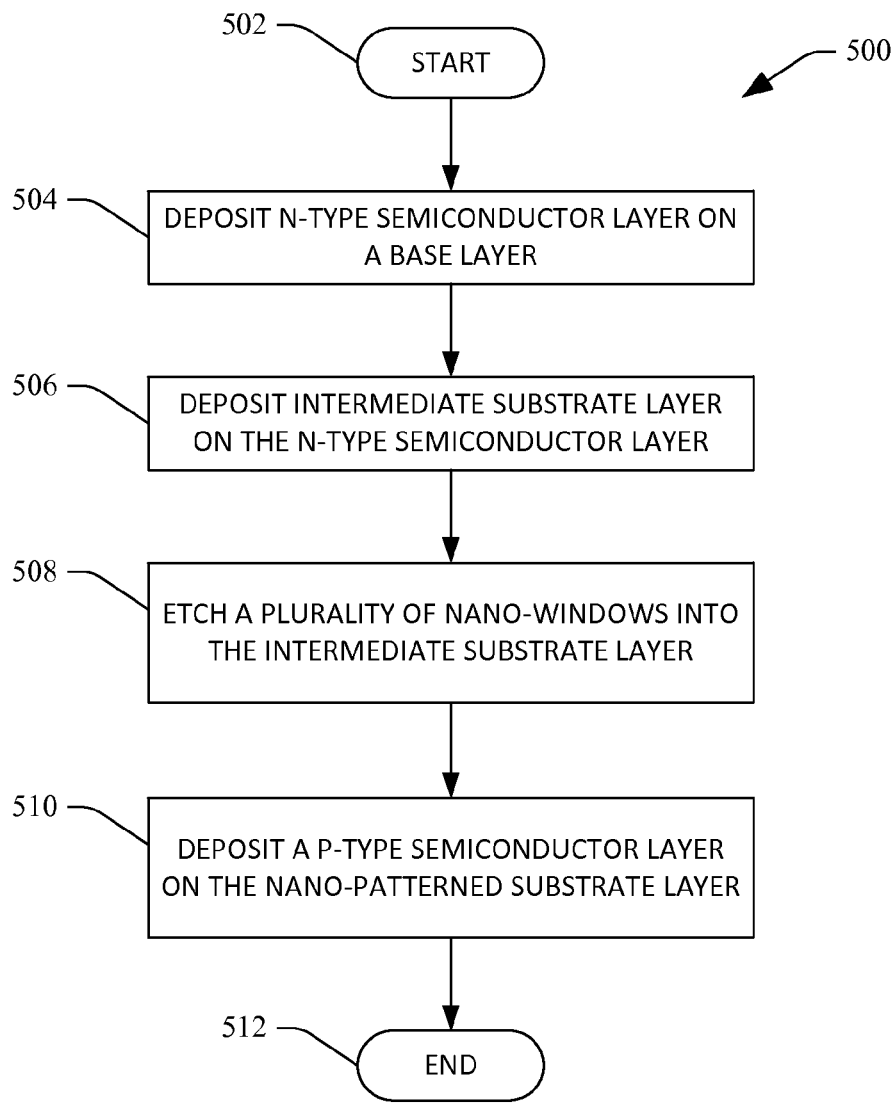
FIG. 5 is a flow diagram illustrating an exemplary methodology for producing a photovoltaic cell comprising a nano-patterned substrate layer.
Figure 6:
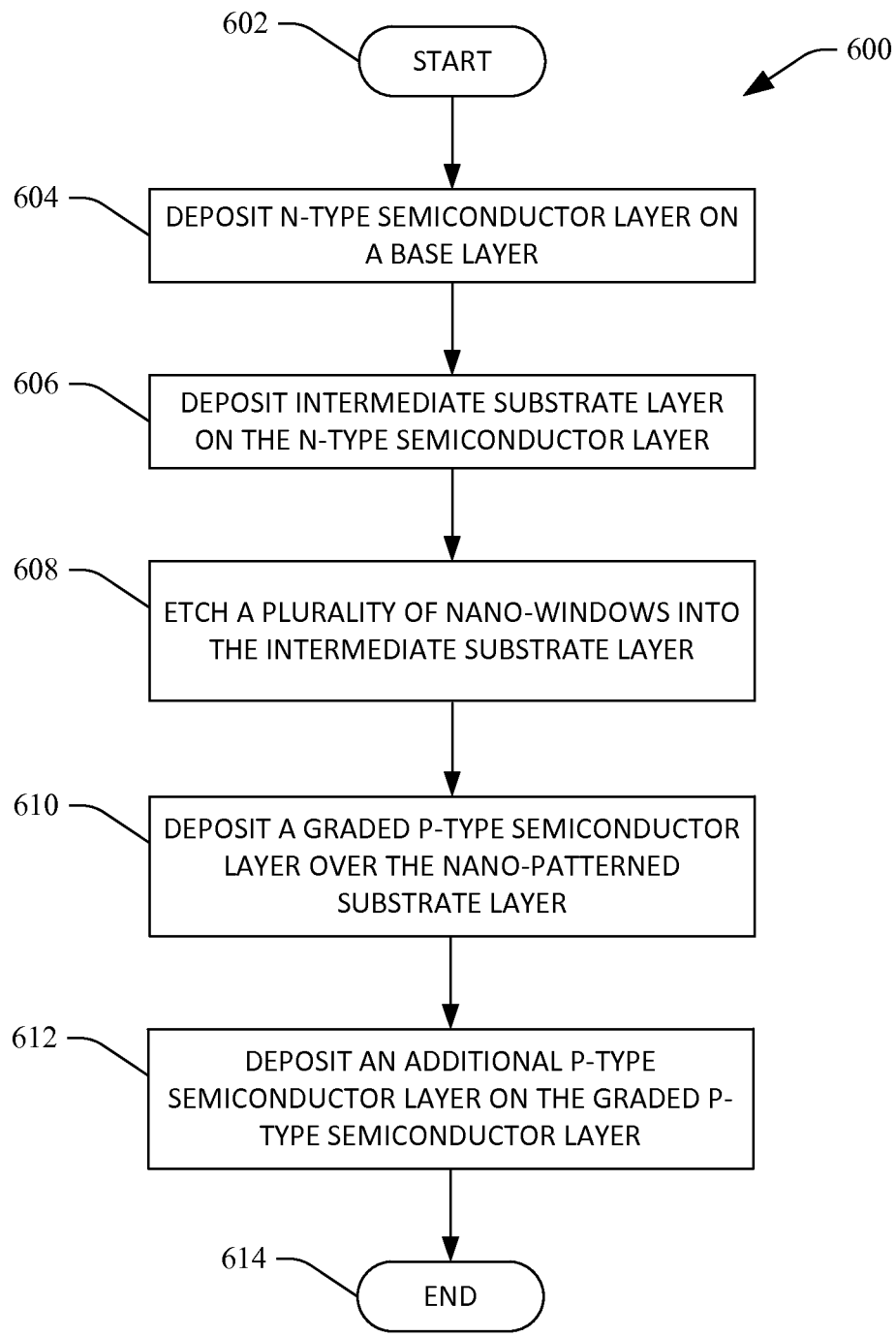
FIG. 6 is a flow diagram illustrating an exemplary methodology for producing a photovoltaic cell comprising a nano-patterned substrate layer and a graded band gap.

With reference now to FIGS. 4-6, various exemplary methodologies are illustrated and described. While the methodologies are described as being a series of acts that are performed in a sequence, it is to be understood that the methodologies are not limited by the order of the sequence. For instance, some acts may occur in a different order than what is described herein. In addition, an act may occur concurrently with another act. Furthermore, in some instances, not all acts may be required to implement a methodology described herein.

Referring now to FIG. 4, a methodology 400 for creating a nano-patterned substrate layer in a photovoltaic cell is illustrated. The methodology 400 starts at 402, and at 404 an intermediate substrate layer is deposited on a first semiconductor layer. The intermediate substrate layer may be deposited, for example, using plasma enhanced chemical vapor deposition, to a thickness of less than 450 nm. The intermediate substrate layer can be composed of, for example, $SiO_2$ or $SiN_4$.

At 406, a plurality of nano-windows is etched into the intermediate substrate layer to create a nano-patterned substrate layer. The intermediate substrate layer may be etched by, for example, completing the following steps: transferring a pattern onto the intermediate substrate layer via reverse tone step and flash imprint lithography, and etching the pattern with Fluoroform ($CHF_3$) gas.

At 408, a second semiconductor layer is deposited over the nano-patterned substrate layer and through the plurality of nano-windows. The second semiconductor layer can be deposited by a deposition method such as chemical bath deposition, chemical vapor deposition, sputtering, hot wire deposition, close-space sublimation, epitaxy, or the like. As the second semiconductor layer is deposited, second semiconductor material accumulates in the plurality of nano-windows, and thus forms a plurality of heterojunctions with the first semiconductor material. The second semiconductor material may grow by way of pseudomorphic growth, whereby a relatively small number of crystal domains forms in each nano-window. The methodology 400 completes at 410.

Referring now to FIG. 5, a methodology 500 for producing a solar cell that comprises a nano-patterned substrate layer is illustrated. The methodology 500 starts at 502, and at 504 an n-type semiconductor layer is deposited on a base layer. In an exemplary embodiment, n-type semiconductor material in the n-type semiconductor layer may be deposited to a thickness of less than 200 nm by chemical bath deposition. In another exemplary embodiment, such n-type semiconductor material can be deposited on the base layer by way of chemical vapor deposition, sputtering, hot wire deposition, close-space sublimation, epitaxy, or the like.

At 506, an intermediate substrate layer is deposited on the n-type semiconductor layer. At 508, a plurality of nano-windows is etched into the intermediate substrate layer to create a nano-patterned substrate layer. At 510, a p-type semiconductor layer is deposited over the nano-patterned substrate layer. The p-type semiconductor layer can be deposited by a deposition method such as chemical bath deposition, chemical vapor deposition, sputtering, hot wire deposition, close-space sublimation, epitaxy, or other methods. The p-type semiconductor layer is deposited such that the nano-patterned substrate is between the p-type semiconductor layer and the n-type semiconductor layer. As the p-type semiconductor layer is deposited, p-type semiconductor material accumulates in the plurality of nano-windows, and thus forms a plurality of heterojunctions with the n-type semiconductor material. The methodology 500 completes at 512.

Referring now to FIG. 6, a methodology 600 for producing a photovoltaic cell with a graded band gap and a nano-patterned substrate layer is illustrated. The methodology 600 starts at 602, and at 604 an n-type semiconductor layer is deposited on a base. At 606, an intermediate substrate layer is deposited on the n-type semiconductor layer. At 608, a plurality of nano-windows is etched into the intermediate substrate layer to create a nano-patterned substrate layer. At 610, a graded p-type semiconductor layer is deposited on the nano-patterned substrate layer. The graded p-type semiconductor layer can be deposited by a deposition method such as chemical bath deposition, chemical vapor deposition, sputtering, hot wire deposition, close-space sublimation, epitaxy, or the like. The graded p-type semiconductor layer is deposited such that the nano-patterned substrate is between the n-type semiconductor layer and the graded p-type semiconductor layer. As the graded p-type semiconductor layer is deposited, graded p-type semiconductor material accumulates in the plurality of nano-windows, and thus forms a plurality of heterojunctions with the n-type semiconductor material. The graded p-type semiconductor material may grow by means of pseudomorphic growth, whereby a relatively small number of crystal domains form in each nano-window of the nano-patterned substrate layer.

At 612, an additional p-type semiconductor layer is deposited on the graded p-type semiconductor layer. The methodology 600 completes at 614.

It is noted that several examples have been provided for purposes of explanation. These examples are not to be construed as limiting the hereto-appended claims. Additionally, it may be recognized that the examples provided herein may be permutated while still falling under the scope of the claims.

We claim:

1. A photovoltaic cell comprising:
an n-type semiconductor layer that is composed of an n-type semiconductor material;
a p-type semiconductor layer that is composed of a p-type semiconductor material; and
a buried mask layer substantially situated between the n-type semiconductor layer and the p-type semiconductor layer, wherein:
a plurality of nano-windows are defined in the buried mask layer, each said nano-window extending entirely through the buried mask layer;
one of said n-type or p-type semiconductor layer underlies the buried mask layer such that a substantially planar upper surface of said underlying n-type or p-type semiconductor layer is adjacent to the buried mask layer;
the other of said n-type or p-type semiconductor layer is a single, continuous semiconductor body that lies substantially over the buried mask layer, fills the plurality of nano-windows, and forms a respective interface with the substantially planar upper surface of the underlying semiconductor layer at each said nano-window; and
a plurality of heterojunctions is formed between the n-type semiconductor layer and the p-type semiconductor layer, each said heterojunction being formed at a respective one of said interfaces, wherein the p-type semiconductor layer has a pseudomorphic crystal structure.

2. The photovoltaic cell of claim 1, wherein the p-type semiconductor is Cadmium Telluride, and wherein the n-type semiconductor material is Cadmium-Sulfide.

3. The photovoltaic cell of claim 1, wherein the p-type semiconductor material is of the formula of $Zn_xCd_{1-x}Te$.

4. The photovoltaic cell of claim 1 having a graded band gap.

5. The photovoltaic cell of claim 1, further comprising:
a transparent conducting film layer positioned immediately adjacent to the n-type semiconductor layer; and
a base substrate layer positioned immediately adjacent to the transparent conducting film layer such that the transparent conducting film layer is disposed between the base substrate layer and the n-type semiconductor layer.

6. The photovoltaic cell of claim 1, wherein the buried mask layer is composed of Silicon Oxide or Silicon Nitride.

7. The photovoltaic cell of claim 1, wherein the buried mask layer has a thickness of less than 450 nm.

8. The photovoltaic cell of claim 1, wherein the n-type semiconductor layer has a thickness of less than 100 nm.

9. The photovoltaic cell of claim 1, wherein each nano-window in the plurality of nano-windows has a length of less than 350 nm, a width of less than 350 nm, and a thickness of less than 450 nm.

10. The photovoltaic cell of claim 1, wherein the plurality of nano-windows comprise the p-type semiconductor material.

11. A photovoltaic cell, comprising:
a glass base substrate layer;
a transparent conducting film layer comprising material of the formula ITO, the transparent conducting film layer located immediately adjacent to the glass base substrate layer;

an n-type semiconductor layer composed of Cadmium Sulfide located immediately adjacent to the transparent conducting film layer, wherein the transparent conducting film layer is between the glass base substrate layer and the n-type semiconductor layer and wherein the n-type semiconductor layer has a substantially planar upper surface opposite to the transparent conducting film layer;

a nano-patterned buried mask layer composed of one of Silicon Oxide or Silicon Nitride, the nano-patterned buried mask layer located immediately adjacent to the n-type semiconductor layer, wherein the n-type semiconductor layer is between the transparent conducting film layer and the nano-patterned buried mask layer, the nano-patterned buried mask layer comprising a plurality of nano-windows, each nano-window in the plurality of nano-windows having a length of less than 350 nm and a width of less than 350 nm; and a p-type semiconductor layer composed of a p-type semiconductor material of the formula $Zn_xCd_{1-x}Te$ located immediately adjacent to the nano-patterned buried mask layer, wherein the nano-patterned buried mask layer is between the n-type semiconductor layer and the p-type semiconductor layer, wherein the p-type semiconductor layer is a single, continuous semiconductor body and the material thereof extends through the plurality of nano-windows to form a plurality of heterojunctions with the n-type semiconductor material, wherein each said heterojunction is formed at an interface between p-type semiconductor material filling a respective one of the nano-windows and the substantially planar upper surface of the n-type semiconductor layer, wherein at least a portion of the p-type semiconductor material has a pseudomorphic crystal structure, and wherein the photovoltaic cell has a graded band gap.

* * * * *